United States Patent
Chen et al.

(10) Patent No.: US 8,310,050 B2
(45) Date of Patent: Nov. 13, 2012

(54) ELECTRONIC DEVICE PACKAGE AND FABRICATION METHOD THEREOF

(76) Inventors: Wei-Ming Chen, Hsinchu (TW);
Shu-Ming Chang, New Taipei (TW)

( * ) Notice: Subject to any disclaimer, the term of this patent is extended or adjusted under 35 U.S.C. 154(b) by 0 days.

(21) Appl. No.: 13/024,902

(22) Filed: Feb. 10, 2011

(65) Prior Publication Data
US 2011/0193225 A1    Aug. 11, 2011

Related U.S. Application Data

(60) Provisional application No. 61/302,998, filed on Feb. 10, 2010.

(51) Int. Cl.
*H01L 23/48* (2006.01)
(52) U.S. Cl. ........................ 257/737; 257/773
(58) Field of Classification Search ................ 257/737, 257/773
See application file for complete search history.

(56) References Cited

U.S. PATENT DOCUMENTS 7,651,889 B2 * 1/2010 Tang et al. ................. 438/114

FOREIGN PATENT DOCUMENTS

CN        101295683 A    10/2008

* cited by examiner

*Primary Examiner* — Douglas Menz
(74) *Attorney, Agent, or Firm* — Birch, Stewart, Kolasch & Birch, LLP

(57) ABSTRACT

A chip package is disclosed. The package includes a carrier substrate, at least two semiconductor chips, a fill material layer, a protective layer, and a plurality of conductive bumps. The carrier substrate includes a grounding region. The semiconductor chips are disposed overlying the grounding region of the carrier substrate. Each semiconductor chip includes at least one signal pad and includes at least one grounding pad electrically connected to the grounding region. The fill material layer is formed overlying the carrier substrate and covers the semiconductor chips. The protective layer covers the fill material layer. The plurality of conductive bumps is disposed overlying the protective layer and is electrically connected to the semiconductor chips. A fabrication method of the chip package is also disclosed.

10 Claims, 7 Drawing Sheets

ELECTRONIC DEVICE PACKAGE AND FABRICATION METHOD THEREOF

CROSS REFERENCE TO RELATED APPLICATIONS

This application claims the benefit of U.S. Provisional Application No. 61/302,998, filed Feb. 10, 2010, the entirety of which is incorporated by reference herein.

BACKGROUND OF THE INVENTION

1. Field of the Invention

The invention relates to an electronic package and more particularly to a chip package with multiple chips and a fabrication method thereof.

2. Description of the Related Art

As demand for electronic or optoelectronic products, such as digital cameras, camera phones, bar code readers, and monitors, increase, semiconductor technology for products made therefrom must develop rapidly, as product trends require miniaturization of the semiconductor chip size and increased and complex functionality of the semiconductor chip.

Therefore, more than one semiconductor chip is typically placed in a sealed package, due to performance demands, for operational stability. However, since more input/output conductive pads are required for multiple semiconductor chips compared to a single semiconductor chip, the semiconductor packaging process is made more difficult, thus reducing manufacturing yields.

Accordingly, there is a need to develop a novel package structure without the above problems.

BRIEF SUMMARY OF THE INVENTION

An embodiment of a chip package comprises a carrier substrate, at least two semiconductor chips, a fill material layer, a protective layer, and a plurality of conductive bumps. The carrier substrate comprises a grounding region. The semiconductor chips are disposed overlying the grounding region of the carrier substrate. Each semiconductor chip comprises at least one signal pad and comprises at least one grounding pad electrically connected to the grounding region. The fill material layer is formed overlying the carrier substrate and covers the semiconductor chips. The protective layer covers the fill material layer. The plurality of conductive bumps is disposed overlying the protective layer and is electrically connected to the semiconductor chips.

A method for fabricating a chip package comprises providing at least two semiconductor chips, overlying a carrier substrate. The carrier substrate comprises a grounding region, and each semiconductor chip comprises at least one signal pad and at least one grounding pad. The grounding pad of each semiconductor chip is electrically connected to the grounding region. A fill material layer is formed overlying the carrier substrate to cover the semiconductor chips. The fill material layer is covered with a protective layer. A plurality of conductive bumps is formed overlying the protective layer and is electrically connected to the semiconductor chips.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
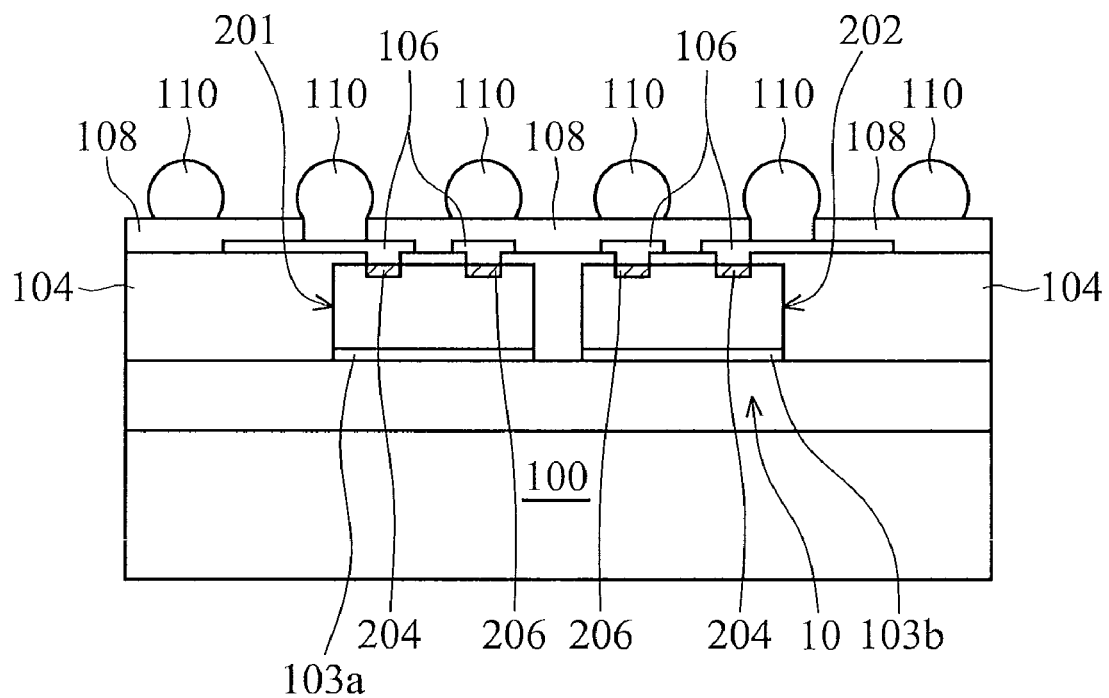
FIGS. 1 to 6 are cross sections of various exemplary embodiments of a chip package according to the invention.

The following description encompasses the fabrication and the purpose of the invention. It can be understood that this description is provided for the purpose of illustrating the fabrication and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Referring to FIG. 1, which is a cross section of an exemplary embodiment of a chip package according to the invention. In the embodiments, the chip package may be applied to various electronic components including active or passive elements, digital or analog integrated circuits, such as optoelectronic devices, micro electro mechanical systems (MEMS), micro fluidic systems, and physical sensors for detecting physical characteristics such as detecting heat, light, or pressure. In particular, a wafer level package (WLP) process may be performed to package semiconductor chips which include image sensor devices, light-emitting diodes (LEDs), solar cells, RF circuits, accelerators, gyroscopes, micro actuators, surface acoustic wave devices, pressure sensors, and ink printer heads.

A wafer level package process involving electronic devices is first packaged at the wafer level and then diced into individual packages. However, in a specific embodiment, separate semiconductor chips may be, for example, redistributed on a carrier wafer for a subsequent packaging process, which may be called a wafer level package process. In addition, a stacking process may also be used in the wafer level package process mentioned above to stack a plurality of wafers having integrated circuits to form electronic device packages of multi-layered integrated circuit devices.

The chip package comprises a carrier substrate 100, such as a raw silicon wafer or other semiconductor substrates without circuits, which can be used for the placement of the semiconductor chips. The carrier substrate 100 comprises a grounding region 10. In the embodiment, the carrier substrate 100 is a silicon substrate and the grounding region 10 is a doping region formed therein and extended to a surface of the silicon substrate. In another embodiment, the doping region can be extended to the entire silicon substrate. Additionally, the grounding region 10 of the carrier substrate 100 may also be used for heat dissipation.

At least two semiconductor chips 201 and 202 are respectively disposed overlying the grounding region 10 of the carrier substrate 100 through conductive adhesion layers 103a and 103b or non-conductive adhesion layers. Moreover, the semiconductor chips 201 and 202 comprise at least one signal pad 204 and at least one grounding pad 206, respectively, wherein the grounding pads 206 may be electrically connected to the grounding region 10 of the carrier substrate 100 by the interconnection structures (not shown) in the semiconductor chips 201 and 202 and the conductive adhesion layers 103a and 103b. Alternatively, the grounding pads 206 may be electrically connected to the grounding region 10 by the wiring structures (not shown) outside of the semiconductor chips 201 and 202.

A fill material layer 104, such as a dry film, is formed overlying the carrier substrate 100 and covers the semiconductor chips 201 and 202. The fill material layer 104 has a plurality of openings exposing the signal pads 204 and grounding pads 206 of the semiconductor chips 201 and 202. A redistribution layer 106 is disposed overlying the fill material layer 104 and is electrically connected to the signal pads 204 and grounding pads 206 of the semiconductor chips 201 and 202, respectively, through the plurality of openings in the fill material layer 104.

A protective layer 108, such as a solder mask, covers the fill material layer 104 and the redistribution layer 106. The protective layer 108 has a plurality of openings exposing portions of the underlying redistribution layer 106 corresponding thereto. A plurality of conductive bumps 110 is correspondingly disposed on the plurality of openings in the protective layer 108 so as to be electrically connected to the corresponding redistribution layer 106.

Figure 2:
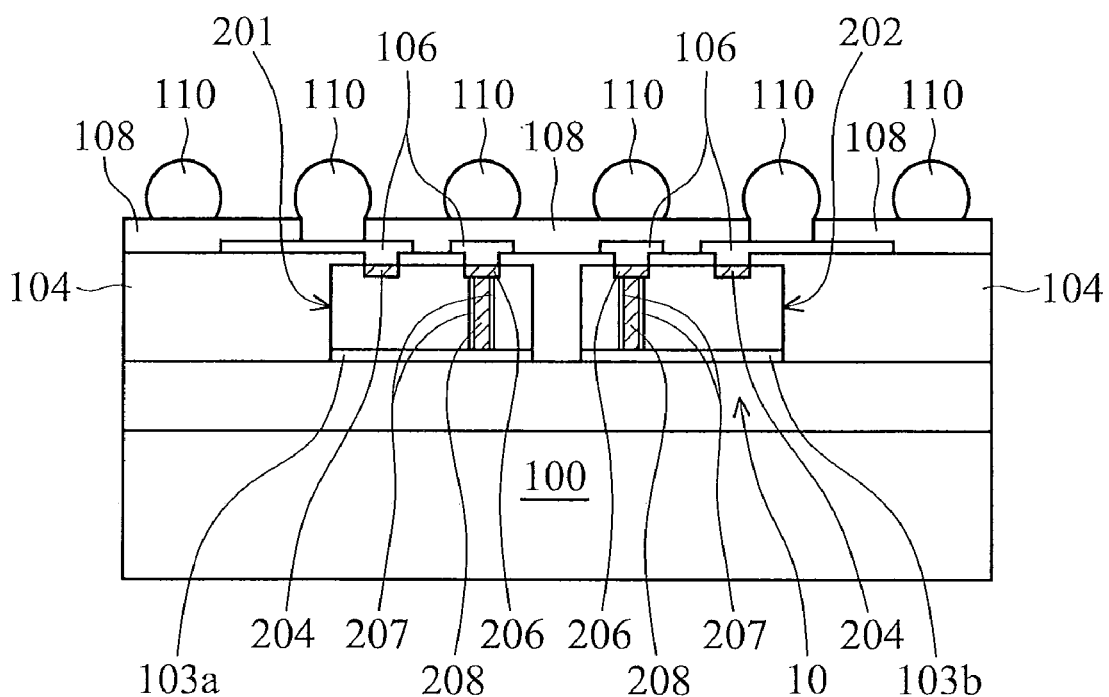

Referring to FIG. 2, which illustrates another exemplary embodiment of a chip package according to the invention. Elements in FIG. 2 that are the same as those in FIG. 1 are labeled with the same reference numbers as in FIG. 1 and are not described again for brevity. In particular, in the embodiment, the grounding pads 206 are electrically connected to the grounding region 10 by the conductive plugs 208 formed in the semiconductor chips 201 and 202 and the conductive adhesion layers 103a and 103b. The sidewalls of conductive plugs 208 typically have insulating spacers 207 comprising, for example, silicon oxide, thereon, such that the conductive plugs 208 are insulated from the substrate material. Moreover, the conductive plugs 208 may be formed by conventional through silicon via (TSV) technology.

Figure 3:
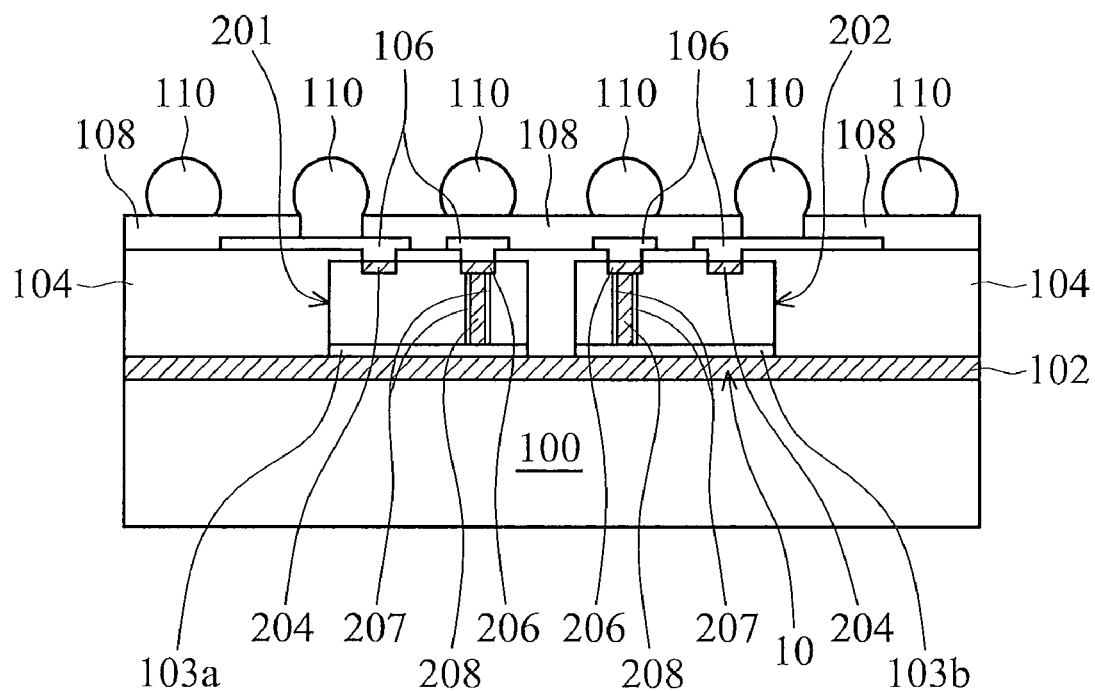

Referring to FIG. 3, which illustrates further another exemplary embodiment of a chip package according to the invention. Elements in FIG. 3 that are the same as those in FIG. 2 are labeled with the same reference numbers as in FIG. 2 and are not described again for brevity. In the embodiment, the carrier substrate 100 does not have any doping region. The grounding region 10 of the carrier substrate 100 comprises a metal layer 102, such as a layer comprising aluminum, copper, or an alloy thereof, thereby providing heat dissipation for the semiconductor chips 201 and 202. Moreover, the grounding pads 206 of the semiconductor chips 201 and 202 are also connected to the grounding region 10 by the conductive plugs 208 and the conductive adhesion layers 103a and 103b.

Figure 4:
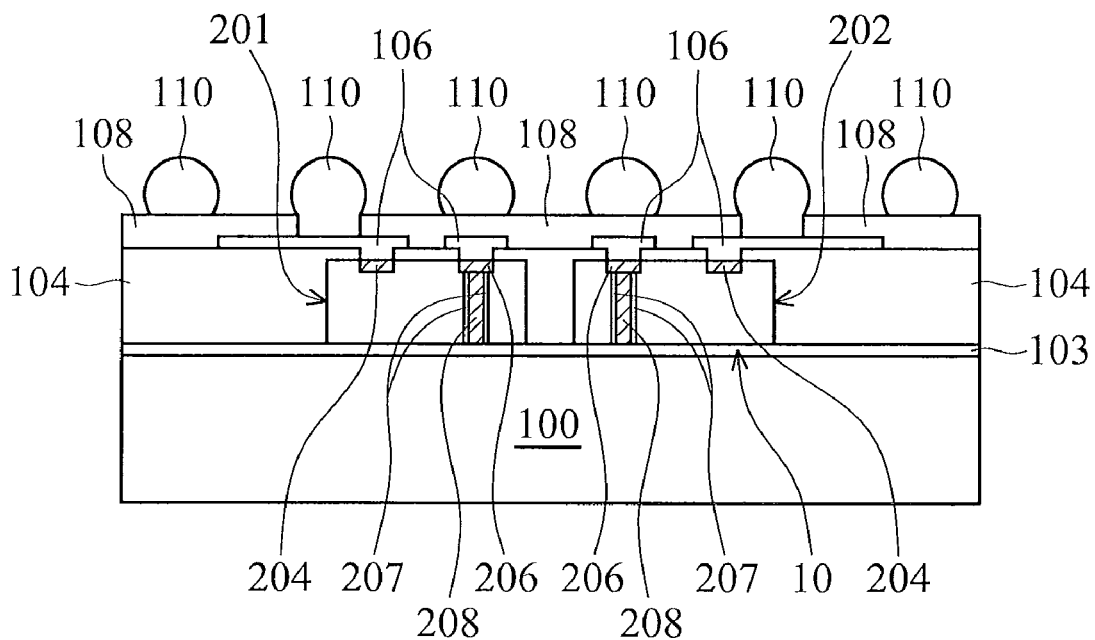

Referring to FIG. 4, which illustrates further another exemplary embodiment of a chip package according to the invention. Elements in FIG. 4 that are the same as those in FIG. 2 are labeled with the same reference numbers as in FIG. 2 and are not described again for brevity. In the embodiment, the carrier substrate 100 does not have any doping region. The grounding region 10 of the carrier substrate 100 comprises a conductive adhesion layer 103 to attach the semiconductor chips 201 and 202 onto the carrier substrate 100.

Figure 5:
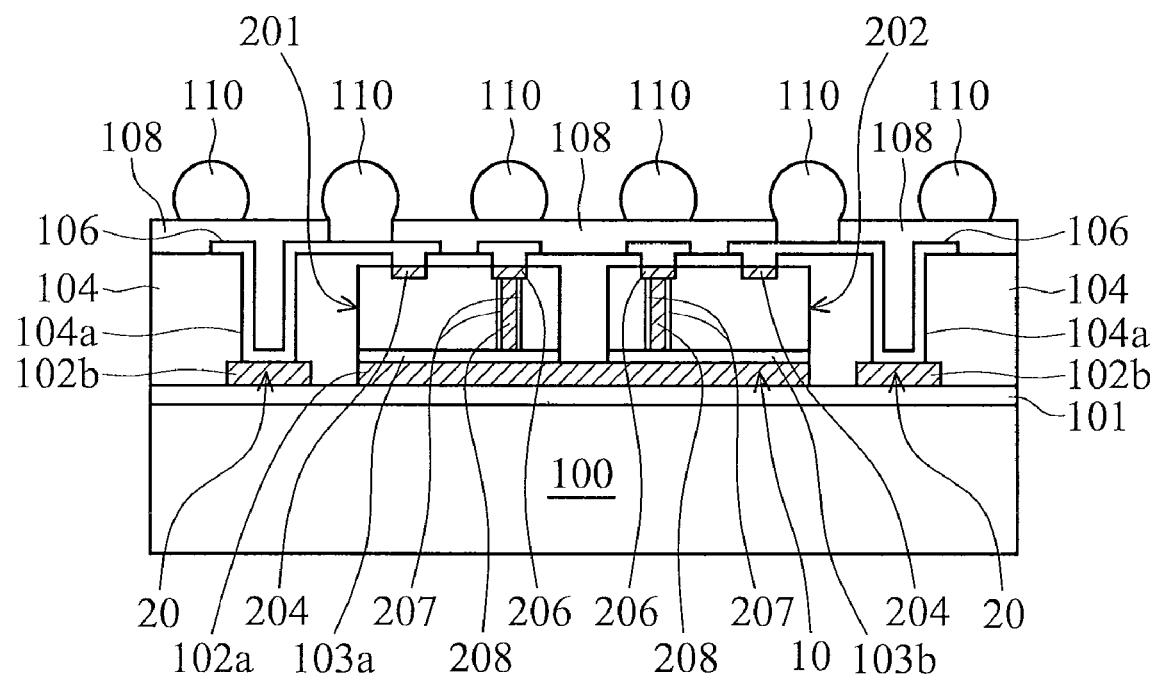

Referring to FIG. 5, which illustrates further another exemplary embodiment of a chip package according to the invention. Elements in FIG. 5 that are the same as those in FIG. 2 are labeled with the same reference numbers as in FIG. 2 and are not described again for brevity. In the embodiment, the carrier substrate 100 does not have any doping region. The carrier substrate 100 comprises a silicon substrate having a dielectric layer on the surface thereof and overlying grounding and signal regions 10 and 20, wherein the grounding region 10 is formed of a metal layer 102a and the signal region 20 is formed of a metal layer 102b. The metal layer 102a may also provide heat dissipation for the semiconductor chips 201 and 202. In one embodiment, the metal layers 102a and 102b are formed of the same metal layer.

The grounding region 10 and the signal region 20 are respectively and electrically connected to the grounding pads 206 and the signal pads 204 of the semiconductor chips 201 and 202. In particular, in the embodiment, the fill material layer 104 has a plurality of openings 104a exposing the metal layer 102b. Moreover, a redistribution layer 106 extends inside the plurality of openings 104a of the fill material layer 104, such that the signal pads 204 are electrically connected to the signal region 20 by the redistribution layer 106.

Figure 6:
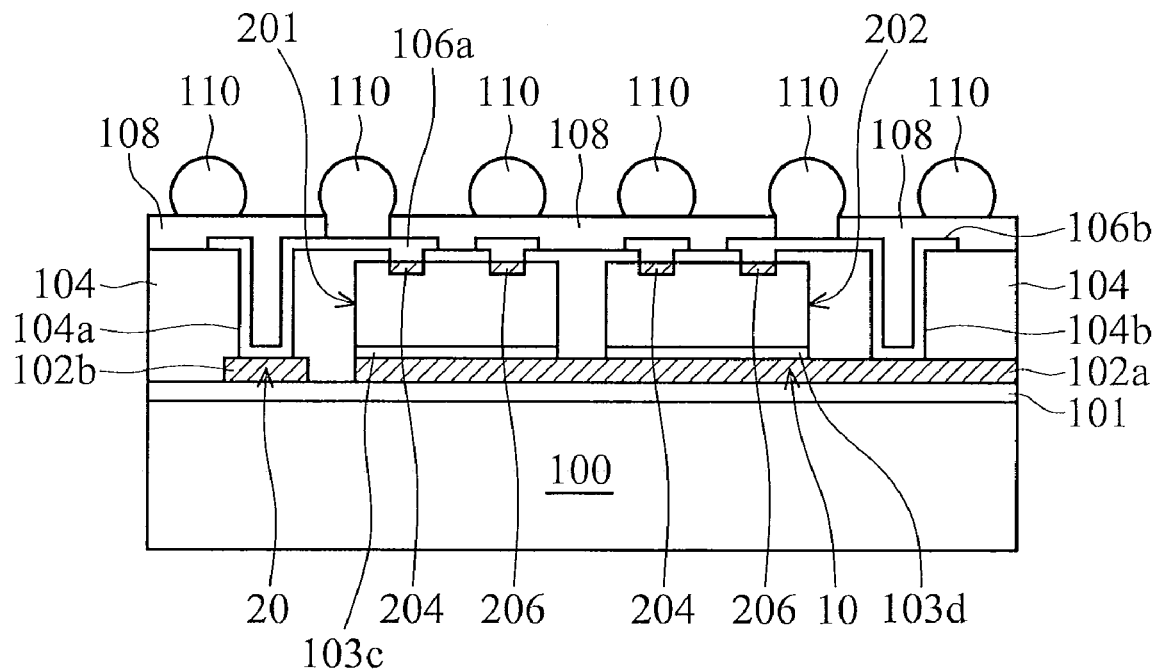

Referring to FIG. 6, which illustrates further another exemplary embodiment of a chip package according to the invention. Elements in FIG. 6 that are the same as those in FIG. 5 are labeled with the same reference numbers as in FIG. 5 and are not described again for brevity. In particular, in the embodiment, the fill material layer 104 has an opening 104a exposing the metal layer 102b and an opening 104b exposing the metal layer 102a. Moreover, two redistribution layers 106a and 106b respectively extend inside the openings 104a and 104b of the fill material layer 104, such that the signal pads 204 are electrically connected to the signal region 20 by the redistribution layer 106a, and the grounding pads 206 are electrically connected to the grounding region 10 by the redistribution layer 106b. Since the grounding pads 206 are not electrically connected to the grounding region 10 by the conductive plugs (e.g. the conductive plugs 208 shown in FIG. 5), the semiconductor chips 201 and 202 can be attached onto the carrier substrate 100 by the conductive adhesion layers or non-conductive adhesion layers 103c and 103d. However, note that in order to simplify the diagram, only the signal pad 204 of the semiconductor chip 201 electrically connected to the signal region 20 by the redistribution layer 106a and the grounding pad 206 of the semiconductor chip 202 electrically connected to the grounding region 10 by the redistribution layer 106b are depicted.

Figure 7A:
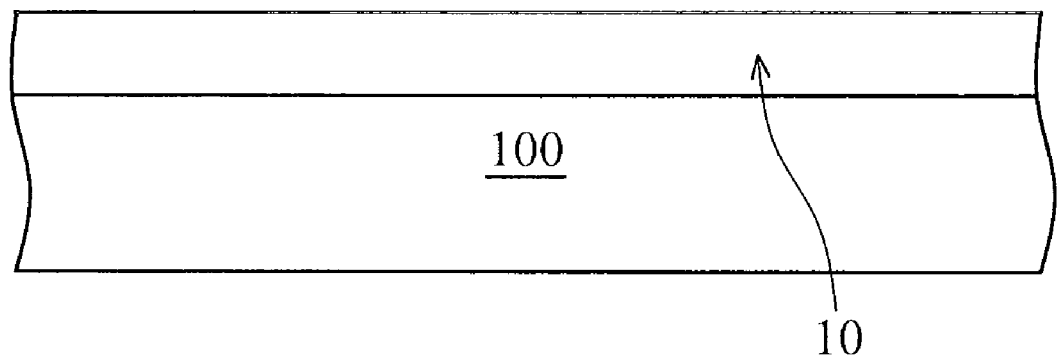
FIGS. 7A to 7D are cross sections of an exemplary embodiment of a method for fabricating a chip package according to the invention.

Referring to FIGS. 7A to 7D, which illustrate an exemplary embodiment of a method for fabricating chip package according to the invention. In FIG. 7A, a carrier substrate 100, such as a raw silicon wafer or other semiconductor substrates without circuits, is provided. The carrier substrate 100 has a plurality of chip regions (not shown) to correspondingly place at least two semiconductor chips in each chip region. In order to simplify the diagram, only a single chip region is depicted. The carrier substrate 100 comprises a grounding region 10. In the embodiment, the carrier substrate 100 is a silicon substrate and the grounding region 10 is a doping region formed therein and formed by ion implantation, such that the doping region extends to a surface of the silicon substrate. In one embodiment, the doping region may extend to entire silicon substrate. In another embodiment, the carrier substrate 100 does not have any doping region, but has a metal layer, such as aluminum, copper, or an alloy thereof, serving as the grounding region 10 (e.g. the metal layer 102 shown in FIG. 3) of the carrier substrate 100.

Figure 7B:
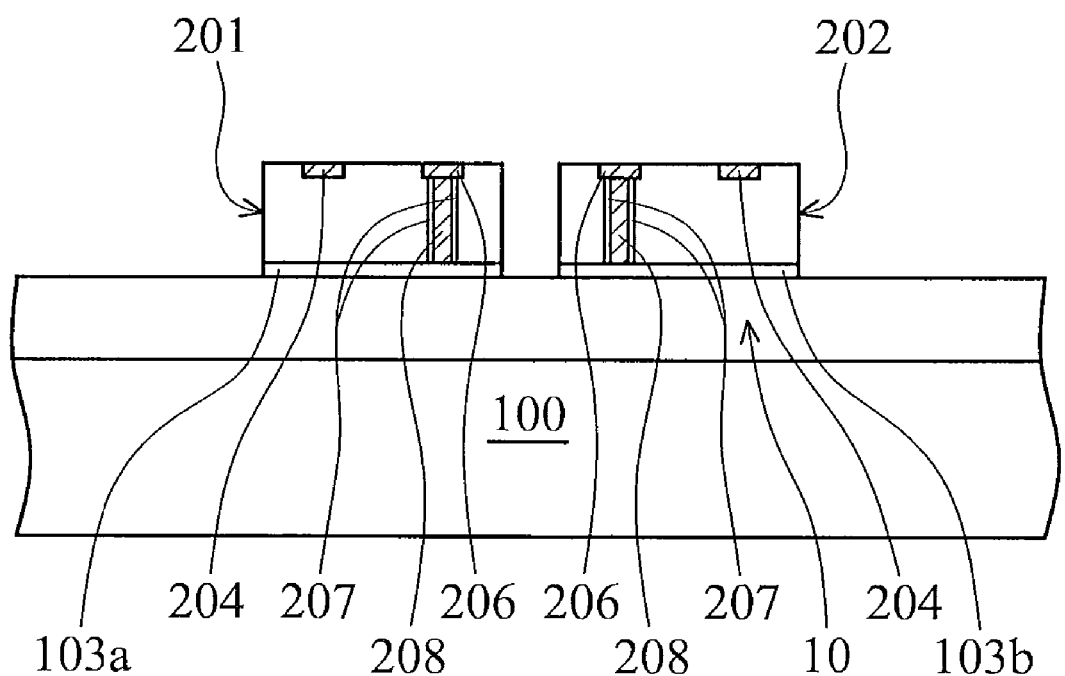

Referring to FIG. 7B, at least two semiconductor chips 201 and 202 are provided. Each semiconductor chip comprises at least one signal pad 204, at least one grounding pad 206, and an underlying conductive plug 208 correspondingly connected to the grounding pad 206, wherein the sidewalls of the conductive plugs 208 have an insulating spacer 207, such as a silicon oxide spacer, such that the conductive plugs 208 are insulated from the substrate materials of the semiconductor chips 201 and 202. Next, the semiconductor chips 201 and 202 are attached onto the carrier substrate 100 by conductive adhesion layers 103a and 103b, such as silver paste or solder, such that the grounding pads 206 are electrically connected to the grounding region 10 by the conductive plugs 208 and the conductive adhesion layers 103a and 103b. In another embodiment, the carrier substrate 100 does not have any doping region, and the semiconductor chips 201 and 202 are attached onto the carrier substrate 100 by a conductive adhesion layer (e.g. the conductive adhesion layer 103 shown in FIG. 4) that serves as the grounding region 10 of the carrier substrate 100, such that the grounding pads 206 are electrically connected to the grounding region 10 by the conductive plugs 208.

Figure 7C:
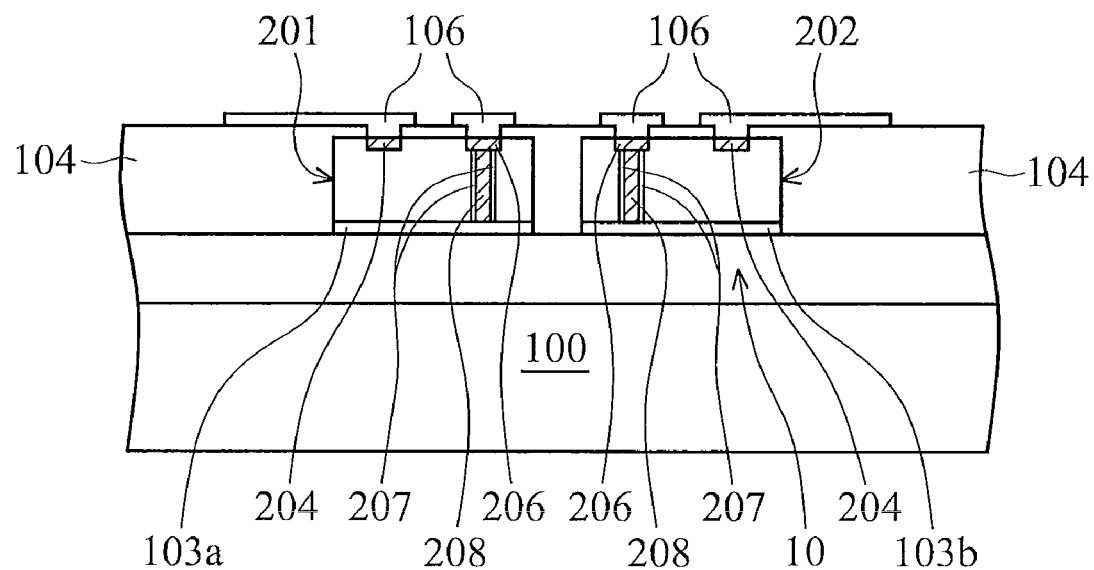

Referring to FIG. 7C, a fill material layer 104, such as a dry film, is formed overlying the carrier substrate 100 to cover the semiconductor chips 201 and 202. Next, a plurality of openings exposing the signal and grounding pads 204 and 206 of the semiconductor chips 201 and 202 are formed in the fill material layer 104 by conventional lithography and etching processes. Next, a redistribution layer 106 is formed overlying the fill material layer 104 and is electrically connected to the exposed signal and grounding pads 204 and 206 through the plurality of openings in the fill material layer 104. The redistribution layer 106 may be formed of aluminum, copper, or other wiring materials well known in the art and formed by conventional deposition methods, such as chemical vapor deposition, physical vapor deposition or plating.

Figure 7D:
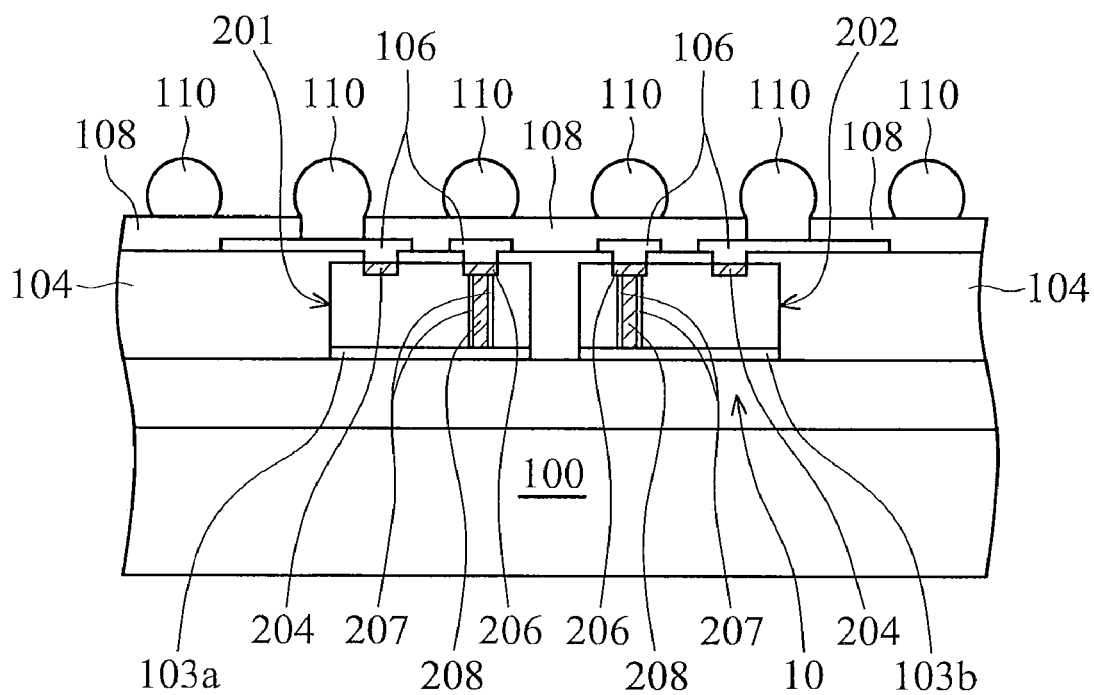

Referring to FIG. 7D, the fill material layer 104 is covered with a protective layer 108, such as a solder mask. Next, a plurality of openings is formed in the protective layer 108 by conventional lithography and etching processes to expose the underlying portions of the redistribution layer 106 corresponding thereto. Next, a plurality of conductive bumps 110 is correspondingly formed in the plurality of openings in the protective layer 108, such that the plurality of conductive bumps 110 is electrically connected to the semiconductor chips 201 and 202 through the redistribution layer 106. In one embodiment, under bump metallization (UBM) layers (not shown) may be formed on the exposed portions of the redistribution layer 106 prior to formation of the plurality of conductive bumps 110.

The carrier substrate 100 may be polished to a desired thickness and then the carrier substrate 100 and the overlying fill material and protective layers 104 and 108 are diced to form individual chip packages, as shown in FIG. 2.

Figure 8A:
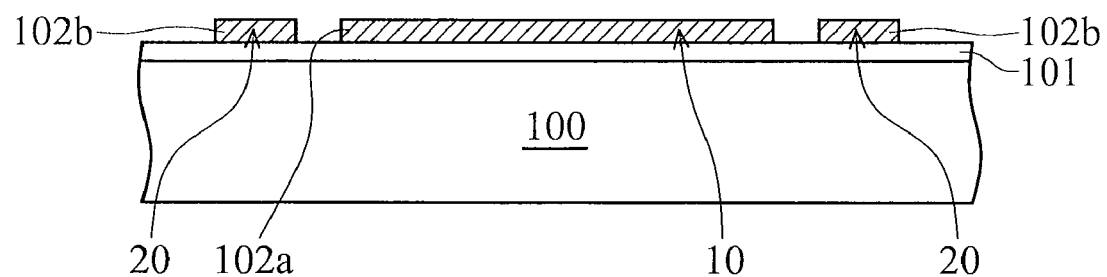
FIGS. 8A to 8D are cross sections of another exemplary embodiment of a method for fabricating a chip package according to the invention.

Referring to FIGS. 8A to 8D, which illustrate another exemplary embodiment of a method for fabricating chip package according to the invention. Elements in FIGS. 8A to 8D that are the same as those in FIGS. 7A and 7D are labeled with the same reference numbers as in FIGS. 7A and 7D and are not described again for brevity. In FIG. 8A, a carrier substrate 100 without any doping regions therein is provided. In the embodiment, the carrier substrate 100 comprises a silicon substrate having a dielectric layer 101 on a surface thereof and overlying grounding and signal regions 10 and 20, wherein the grounding region 10 is formed of a metal layer 102a and the signal region 20 is formed of a metal layer 102b. In one embodiment, the metal layers 102a and 102b are formed of the same metal layer.

Figure 8B:
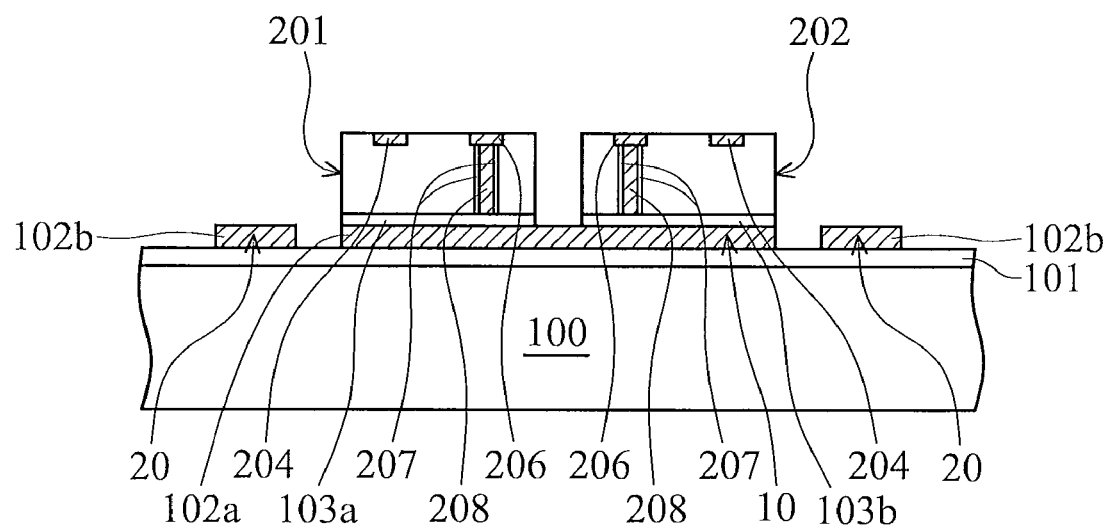

Referring to FIG. 8B, at least two semiconductor chips 201 and 202 are provided and then respectively attached onto the grounding region 10 (i.e. the metal layer 102a) of the carrier substrate 100 by the conductive adhesion layers 103a and 103b, such that the grounding pads 206 are electrically connected to the grounding region 10 by conductive plugs 208 and conductive adhesion layers 103a and 103b, wherein the metal layer 102a may also provide heat dissipation for the semiconductor chips 201 and 202.

Figure 8C:
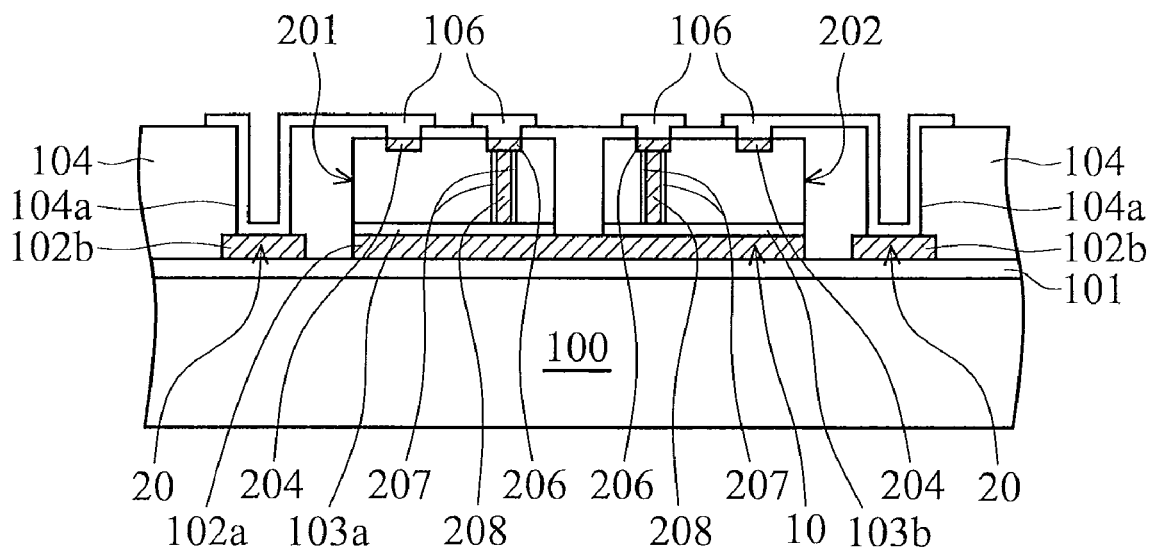

Referring to FIG. 8C, a fill material layer 104 is formed overlying the carrier substrate 100 and covers the semiconductor chips 201 and 202. Next, a plurality of openings is formed in the fill material layer 104 by conventional lithography and etching processes to expose the signal and grounding pads 204 and 206 of the semiconductor chips 201 and 202. At the same time, a plurality of openings 104a is formed in the fill material layer 104 above the signal region 20 (i.e. the metal layer 102b) to expose the metal layer 102b. Next, a redistribution layer 106 is formed overlying the fill material layer 104 and is electrically connected to the exposed signal and grounding pads 204 and 206 and the metal layer 102b through the pluralities of openings in the fill material layer 104.

In another embodiment, the semiconductor chips 201 and 202 do not have conductive plugs therein. Namely, the grounding pads 206 are not electrically connected to the grounding region 10 by the conductive plugs (e.g. the conductive plugs 208 shown in FIG. 5) and thus the semiconductor chips 201 and 201 may be attached onto the carrier substrate 100 by the conductive adhesion layer or non-conductive adhesion layer (e.g. the non-conductive adhesion layers 103c and 103d shown in FIG. 6). In particular, in this case, a plurality of openings (e.g. the openings 104b shown in FIG. 6) is formed in the fill material layer 104 above the grounding region 10 (e.g. the metal layer 102a shown in FIG. 6) when the plurality of openings 104a is being formed, thereby exposing the grounding region 10. Moreover, two redistribution layers (e.g. the redistribution layers 106a and 106b shown in FIG. 6) are respectively formed in the openings that expose the grounding and signal regions 10 and 20, such that the grounding and signal pads 206 and 206 are electrically connected to the grounding and signal regions 10 and 20, respectively, by the redistribution layers.

Figure 8D:
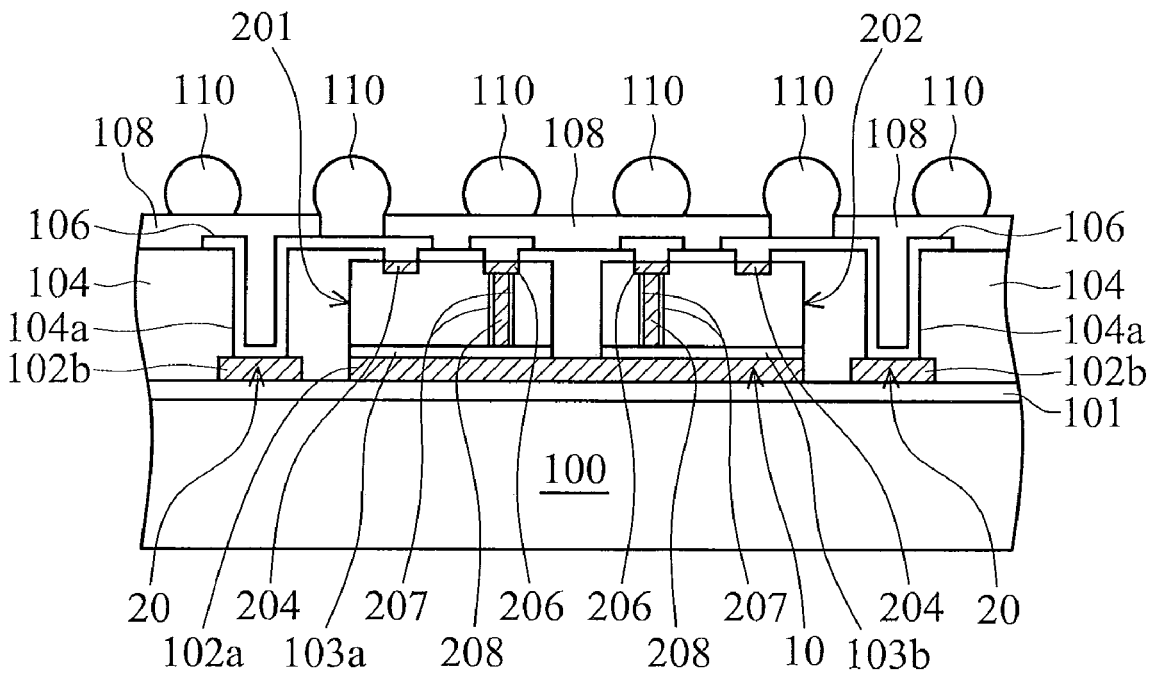

Referring to FIG. 8D, the fill material layer 104 and the redistribution layer 106 are covered with a protective layer 108, such as a solder mask. Next, a plurality of openings is formed in the protective layer 108 to expose the underlying portions of the redistribution layer 106 corresponding thereto. Next, a plurality of conductive bumps 110 is correspondingly formed in the plurality of openings in the protective layer 108, such that the plurality of conductive bumps 110 is electrically connected to the semiconductor chips 201 and 202 by the redistribution layer 106.

Thereafter, the carrier substrate 100 may be polished to a desired thickness and then the carrier substrate 100 and the overlying fill material and protective layers 104 and 108 are diced to form individual chip packages, as shown in FIG. 5.

According to the aforementioned embodiments, since the grounding region and or the signal region between the carrier substrate and the semiconductor chip can serve as a redistribution layer for the grounding pad and/or the signal pad of the semiconductor chip, the number of the conductive bumps required for the electronic device package can be reduced, thereby meeting multiple chips package trends and requirements and reducing the difficulty for the semiconductor packaging process. Moreover, the carrier substrate having a grounding region formed of metal or silicon may also provide heat dissipation for the semiconductor chips.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a carrier substrate comprising a grounding region;
at least two semiconductor chips disposed overlying the grounding region of the carrier substrate, wherein each semiconductor chip comprises at least one signal pad and comprises at least one grounding pad electrically connected to the grounding region;
a fill material layer formed overlying the carrier substrate and covering the semiconductor chips;
a protective layer covering the fill material layer; and
a plurality of conductive bumps disposed overlying the protective layer and electrically connected to the semiconductor chips.

2. The chip package of claim 1, wherein the carrier substrate is a silicon substrate and the grounding region is a doping region formed therein and extended to a surface of the silicon substrate.

3. The chip package of claim 1, wherein the grounding region comprises a conductive adhesion layer, such that the semiconductor chips are attached onto the carrier substrate.

4. The chip package of claim 1, wherein the grounding region comprises a metal layer.

5. The chip package of claim 4, wherein the carrier substrate is a silicon substrate having a dielectric layer thereon, and the metal layer is on the dielectric layer.

6. The chip package of claim 1, further comprises a redistribution layer disposed in the fill material layer for electrical connection between the grounding region and the grounding pad of each semiconductor chip.

7. The chip package of claim 1, wherein the carrier substrate further comprises a signal region electrically connected to the signal pad.

8. The chip package of claim 7, wherein the grounding region and the signal region are formed of the same metal layer.

9. The chip package of claim 7, further comprises two redistribution layers disposed in the fill material layer for electrical connection between the grounding region and the grounding pad of each semiconductor chip and for electrical connection between the signal region and the signal pad of at least one of the semiconductor chips, respectively.

10. The chip package of claim 1, further comprises a redistribution layer disposed between the fill material layer and the protective layer for electrical connection between the signal pad of each semiconductor chip and a corresponding conductive bump.

* * * * *